(12) United States Patent
Nakabayashi

(10) Patent No.: US 8,003,462 B2
(45) Date of Patent: Aug. 23, 2011

(54) MANUFACTURE METHOD FOR SEMICONDUCTOR DEVICE HAVING MIM CAPACITOR, AND SEMICONDUCTOR DEVICE

(75) Inventor: Masaaki Nakabayashi, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 372 days.

(21) Appl. No.: 12/365,276

(22) Filed: Feb. 4, 2009

(65) Prior Publication Data

US 2009/0316331 A1 Dec. 24, 2009

(30) Foreign Application Priority Data

Jun. 24, 2008 (JP) ................................. 2008-164701

(51) Int. Cl.
*H01L 21/8242* (2006.01)
(52) U.S. Cl. .. 438/240; 438/396; 257/303; 257/E21.648
(58) Field of Classification Search .................. 257/296, 257/303, 306, 310, E21.648; 438/239, 240, 438/250, 253, 396, 393
See application file for complete search history.

(56) References Cited

U.S. PATENT DOCUMENTS 6,475,854 B2 * 11/2002 Narwankar et al. ........... 438/238
6,485,988 B2 * 11/2002 Ma et al. ........................... 438/3

FOREIGN PATENT DOCUMENTS

JP 2002-164506 A 6/2002
JP 2004-039728 A 2/2004

* cited by examiner

*Primary Examiner* — David Vu
(74) *Attorney, Agent, or Firm* — Westerman, Hattori, Daniels & Adrian, LLP

(57) ABSTRACT

A first electrode film containing TiAlN and a main dielectric film containing tantalum oxide are formed over a semiconductor substrate. Anneal is performed in the state that the first electrode film and the main dielectric film are formed, to react aluminum (Al) in the first electrode film with oxygen (O) in the main dielectric film and form a subsidiary dielectric film containing aluminum oxide at an interface between the first electrode film and the main dielectric film. A second electrode film is formed facing the first electrode film via the main dielectric film and the subsidiary dielectric film.

9 Claims, 11 Drawing Sheets

FIG.4B FIG.4C FIG.4D

MANUFACTURE METHOD FOR SEMICONDUCTOR DEVICE HAVING MIM CAPACITOR, AND SEMICONDUCTOR DEVICE

CROSS-REFERENCE TO RELATED APPLICATION

This application is based upon and claims the benefit of priority of the prior Japanese Patent Application No. 2008-164701, filed on Jun. 24, 2008, the entire contents of which are incorporated herein by reference.

FIELD

The embodiments discussed herein are related to a manufacture method for a semiconductor device having a MIM (Metal/Insulator/Metal) capacitor, and a semiconductor device having a MIM capacitor.

BACKGROUND

A MIM capacitor used in an analog device, a high frequency device or the like is miniaturized as the device is highly integrated. In order to compensate for reduced capacitance due to miniaturization, a dielectric film is required to be thinner. Thinning the dielectric film effects an increase in leak current. There is therefore a limit in thinning a dielectric film.

In order to prevent an increase in leak current and maintain a large capacitance, material having a higher dielectric constant than that of conventional SiON and the like is being adopted for a dielectric film. Examples of high dielectric constant material include alumina ($Al_2O_3$), tantalum oxide ($Ta_2O_5$) and the like. Titanium nitride (TiN) is generally used as the material of a lower electrode of a MIM capacitor.

If TiN constituting the lower electrode is exposed to oxidizing atmosphere during forming a dielectric film, the surface of the lower electrode is oxidized and a titanium oxide is formed. The titanium oxide formed on the surface of the lower electrode may cause an increase in leak current and a lowered manufacture yield. Oxidation of the TiN film can be prevented by forming an AlN film on the TiN film and forming an oxide dielectric film on the AlN film.

If a $Ta_2O_5$ film is formed on a lower electrode of Al and heat treatment is performed, an $Al_2O_3$ film can be formed at an interface between the $Ta_2O_5$ film and lower electrode of Al. A breakdown voltage can be increased by forming the $Al_2O_3$ film.

SUMMARY

A manufacture method for a semiconductor device includes:

forming a first electrode film containing TiAlN and a main dielectric film containing tantalum oxide over a semiconductor substrate;

performing anneal in a state that the first electrode film and the main dielectric film are formed, to react aluminum in the first electrode film with oxygen in the main dielectric film and form a subsidiary dielectric film containing aluminum oxide at an interface between the first electrode film and the main dielectric film; and forming a second electrode film facing the first electrode film via the main dielectric film and the subsidiary dielectric film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4B to 4D are cross sectional views of the samples S1 to S3, respectively.

DESCRIPTION OF EMBODIMENTS

With reference to FIGS. 1A to 1F, description will be made on a manufacture method for a semiconductor device according to an embodiment. FIGS. 1A to 1F are cross sectional views of main portions of the semiconductor device during manufacture.

Figure 1A:
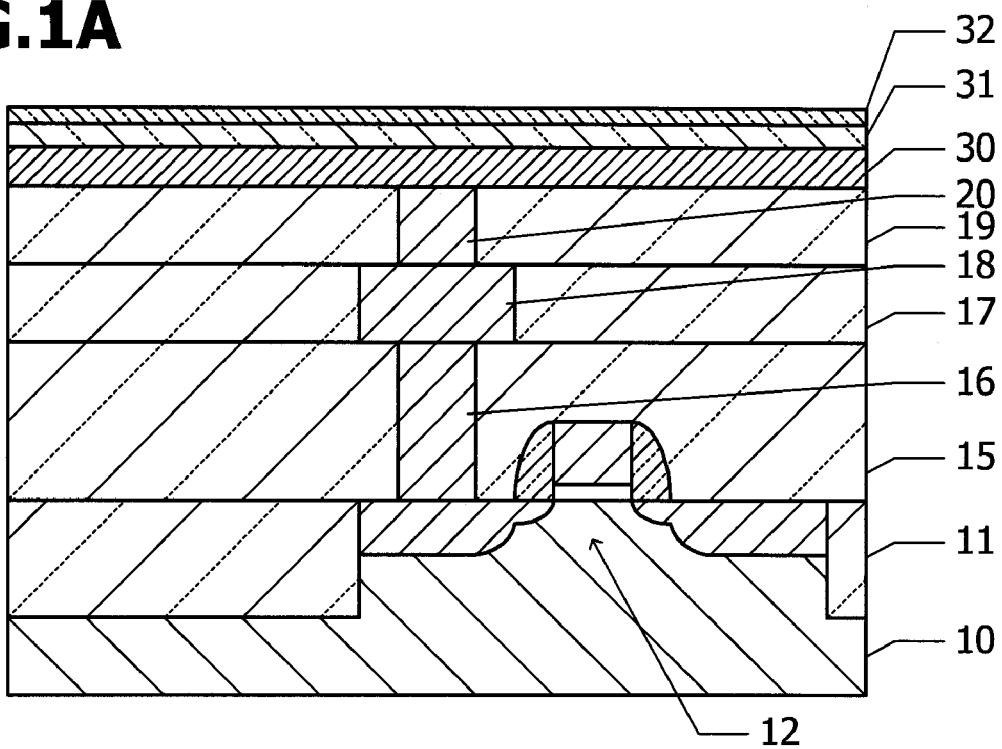
FIGS. 1A to 1F are cross sectional views of main portions of a semiconductor device of an embodiment during manufacture.

As illustrated in FIG. 1A, an element isolation insulating film 11 is formed in the surface layer of a semiconductor substrate 10 of silicon or the like by shallow trench isolation (STI) or the like. A wafer of 300 mm in diameter is used for the semiconductor substrate 10. A MISFET 12 is formed in an active region surrounded by the element isolation insulating film 11. An interlayer insulating film 15 is formed on the semiconductor substrate 10, covering the MISFET 12. A via hole is formed through the interlayer insulating film 15, and the via hole is filled with a conductive plug 16 of tungsten or the like. The conductive plug 16 is connected to, for example, the source of the MISFET 12.

A second interlayer insulating film 17 is formed on the interlayer insulating film 16. A wiring 18 is formed in the interlayer insulating film 17, for example, by a single damascene method. The wiring 18 is connected to the conductive plug 16. A third interlayer insulating film 19 is formed on the interlayer insulating film 17. A via hole is formed through the interlayer insulating film 19, and the via hole is filled with a conductive plug 20 of tungsten or the like. The conductive plug 20 is connected to the wiring 18.

A lower electrode film 30 of TiAlN is formed on the interlayer insulating film 19. The lower electrode film 30 is formed, for example, by DC magnetron reactive sputtering. The film forming conditions are, for example, as follows:
Target: AlTi alloy
Substrate temperature: 300° C.
Sputtering gas: Ar (flow rate of 500 sccm)+$N_2$ (flow rate of 25 sccm)
Applied DC power: 1 kW
Pressure: 40 Pa (0.3 Torr)

A main dielectric film 31 of $Ta_2O_5$ is formed on the lower electrode film 30. The main dielectric film 31 is formed, for example, by plasma enhanced chemical vapor deposition (PE-CVD). The film forming conditions are, for example, as follows:
Ta source material: pentaethoxytantalum (Ta(OEt)$_5$)
Oxidizing gas: $O_2$ (flow rate of 100 sccm)
Carrier gas: Ar (flow rate of 500 sccm)
Substrate temperature: 300° C.
RF power: 450 W
Pressure: $1.3 \times 10^3$ Pa (10 Torr)

An upper subsidiary dielectric film 32 of $Al_2O_3$ is formed on the main dielectric film 31. The upper subsidiary dielectric film 31 is formed, for example, by PE-CVD. The film forming conditions are, for example, as follows:
Al source material: trimethylaluminum (TMA)
Oxidizing gas: $O_2$ (flow rate of 150 sccm)
Carrier gas: Ar (flow rate of 500 sccm)
Substrate temperature: 300° C.
RF power: 600 W
Pressure: $1.3 \times 10^3$ Pa (10 Torr)

Figure 1B:
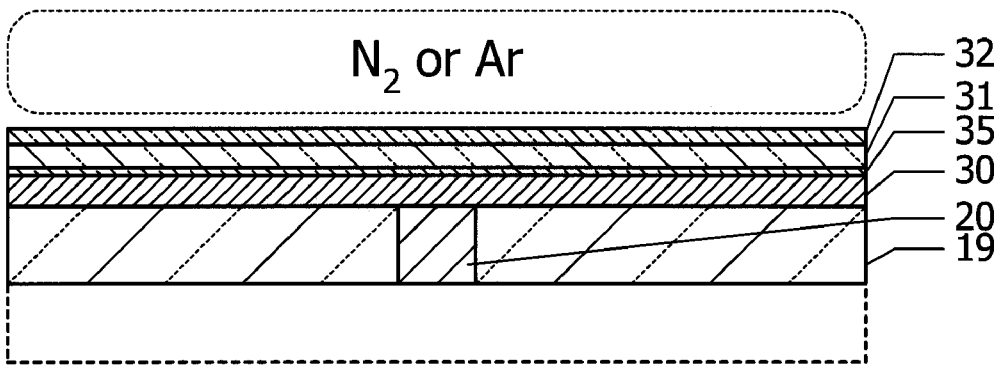

As illustrated in FIG. 1B, anneal is performed in an $N_2$ or Ar atmosphere. Rapid thermal anneal (RTA) is applied, for example, for this anneal. The anneal conditions are, for example, as follows:
Pressure: $1.0 \times 10^5$ Pa (760 Torr)
$N_2$ or Ar flow rate: 3 slm
Anneal time: 1 minute
Anneal temperature: 400° C. to 600° C.

With this anneal, Al in the lower electrode film 30 and O in the main dielectric film 31 react with each other to form a lower subsidiary dielectric film 35 of $Al_2O_3$ at the interface between the two films. It was confirmed by X-ray photoelectron spectroscopy (XPS) that the low subsidiary dielectric film 35 was formed. XPS results will be later described with reference to FIGS. 2A to 2C.

Figure 1C:
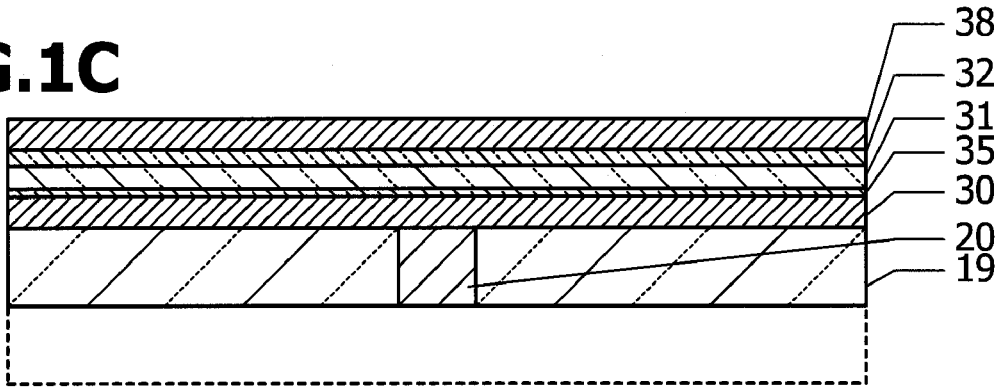
Figure 1D:
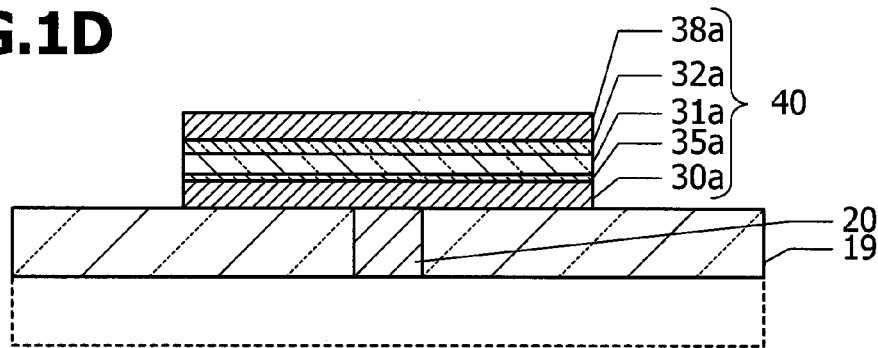
Figure 1E:
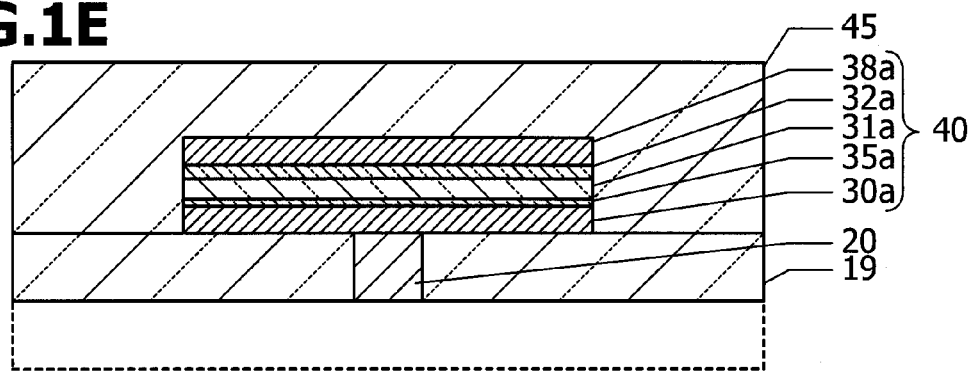

As illustrated in FIG. 1C, an upper electrode film 38 of TiN is formed on the upper subsidiary dielectric film 32. The upper electrode film 38 is formed, for example, by DC magnetron reactive sputtering. The film forming conditions are, for example, as follows:
Target: Ti
Sputtering gas: Ar (flow rate of 500 sccm)+$N_2$ (flow rate of 500 sccm)
Applied DC power: 1 kW
Pressure: 67 Pa (0.5 Torr)
Film forming time: 3 minutes As illustrated in FIG. 1D, each of the films from the upper electrode film 38 to the lower electrode film 30 is patterned by using the same etching mask. These films are etched, for example, by using a two-frequency induction coupling type plasma etching system. The etching conditions are, for example, as follows:
Etching gas: $CHF_3$ (flow rate of 30 sccm)+Ar (flow rate of 100 sccm)
Pressure: 2.0 Pa (15 mTorr)
Etching time: 44 seconds
RF power: 100 W/500 W A MIM capacitor 40 is constituted of a lower electrode 30a of TiAlN, a lower subsidiary dielectric film 35a of $Al_2O_3$, a main dielectric film 31a of $Ta_2O_5$, an upper subsidiary dielectric film 32a of $Al_2O_3$, and an upper electrode 38a of TiN. The MIM capacitor 40 includes the underlying conductive plug 20 as viewed in plan As illustrated in FIG. 1E, another interlayer insulating film 45 is formed on the interlayer insulating film 19. The interlayer insulating film 45 covers the MIM capacitor 40.

Figure 1F:
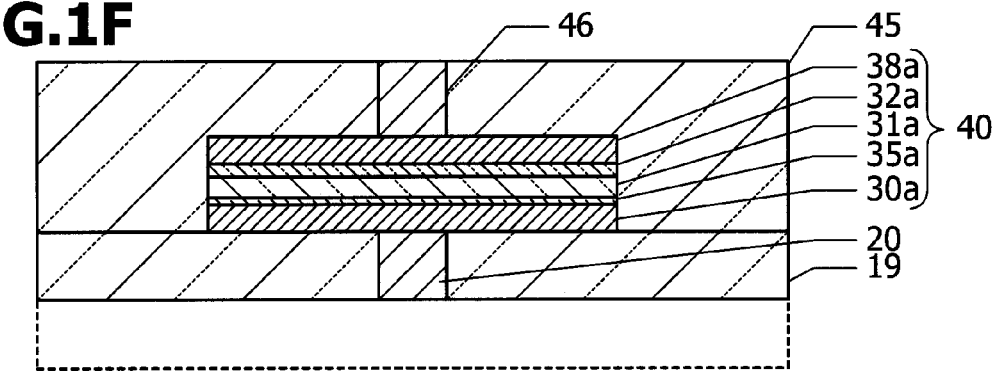

As illustrated in FIG. 1F, a via hole is formed through the interlayer insulating film 45, and the via hole is filled with a conductive plug 46. The conductive plug 46 is disposed inside the MIM capacitor 40 as viewed in plan, and connected to the upper electrode 38a. The upper electrode 38a is connected to a ground line or power source line.

Figure 2A:
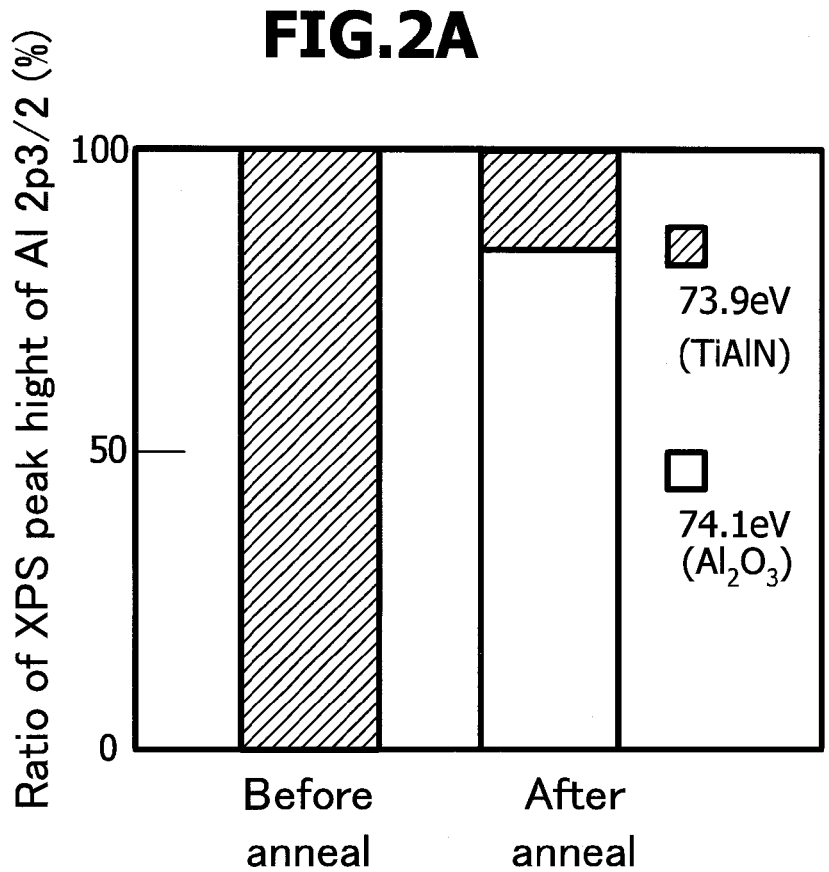
FIG. 2A is a graph representing a ratio between a peak height caused by Al of TiAlN and a peak height caused by Al of $Al_2O_3$ before and after anneal.
Figure 2B:
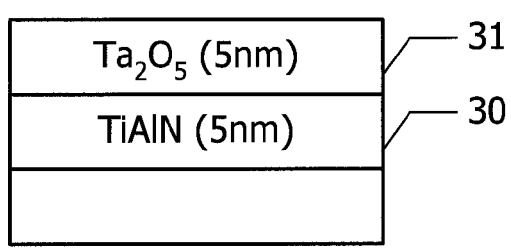
FIG. 2B is a cross sectional view of a sample before anneal.
Figure 2C:
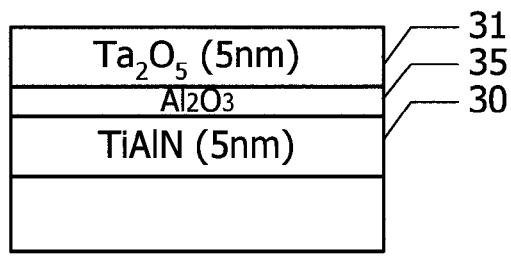
FIG. 2C is a cross sectional view of a sample after anneal.

With reference to FIGS. 2A to 2C, description will be made on the results of verifying that the $Al_2O_3$ lower subsidiary dielectric film 35 is formed at the interface between the TiAlN lower electrode film 30 and $Ta_2O_5$ main dielectric film 31.

FIG. 2B is a cross sectional view of a manufactured sample before anneal. A TiAlN lower electrode film 30 having a thickness of 5 nm is formed on a substrate, and a $Ta_2O_5$ main dielectric film 31 having a thickness of 5 nm is formed on the TiAlN lower electrode film 30. In forming the lower electrode film 30, an AlTi alloy target was used, a content ratio of Al to Ti (Al/Ti) of the AlTi alloy target being equal to 30 atm %. Anneal was performed at 400° C. in an $N_2$ atmosphere.

2p3/2 spectrum of Al was observed by XPS with respect to samples before and after annealing. A peak caused by TiAlN appears at a position of 73.9 eV, and a peak caused by $Al_2O_3$ appears at a position of 74.1 eV.

FIG. 2A illustrates calculation results of a ratio between a peak height caused by TiAlN and a peak height caused by $Al_2O_3$. Although a peak caused by $Al_2O_3$ was not observed before anneal, a peak caused by $Al_2O_3$ was observed after anneal. It can be understood from this evaluation result that although an $Al_2O_3$ film is not formed before anneal as illustrated in FIG. 2B, the $Al_2O_3$ lower subsidiary dielectric film 35 is formed at the interface between the TiAlN lower electrode film 30 and $Ta_2O_5$ main dielectric film 31 of the sample after anneal as illustrated in FIG. 2C. The peak caused by TiAlN is observed in the sample after anneal, because the $Al_2O_3$ lower subsidiary dielectric film 35 is thin and the underlying TiAlN is detected. A thickness of the lower subsidiary dielectric film 35 was 0.53 nm.

A MIM capacitor of the embodiment and a conventional MIM capacitor (comparative example) were manufactured, and a capacitance per unit area and a leak current were measured.

Figure 3A:
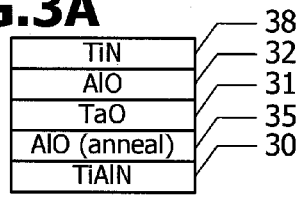
FIGS. 3A and 3B are cross sectional views of MIM capacitors according to an embodiment and a comparative example, respectively.
Figure 3B:
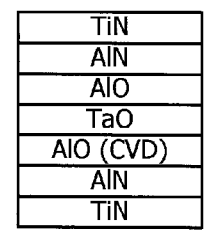

FIG. 3A is a cross sectional view of a MIM capacitor of the embodiment, and FIG. 3B is a cross sectional view of a MIM capacitor of the comparative example. The $Al_2O_3$ lower subsidiary dielectric film 35 of the MIM capacitor of the embodiment is formed by anneal. The MIM capacitor of the comparative example is made of seven layers: a TiN film as a lower electrode, an AlN film, an $Al_2O_3$ film, a $Ta_2O_5$ film, an $Al_2O_3$, an AlN film and a TiN film as an upper electrode. The upper and lower $Al_2O_3$ films of the MIM capacitor of the comparative example are both formed by CVD.

In the sample of the embodiment, a thickness of the $Ta_2O_5$ main dielectric film 31 was set to 6 nm, and a thickness of the $Al_2O_3$ upper subsidiary dielectric film 32 was set to 4 nm. In the sample of the comparative example, thicknesses of the lower AlN film, $Ta_2O_5$ film, upper $Al_2O_3$ film and upper AlN film were set to 50 nm, 6 nm, 4 nm and 50 nm, respectively.

Figure 3C:
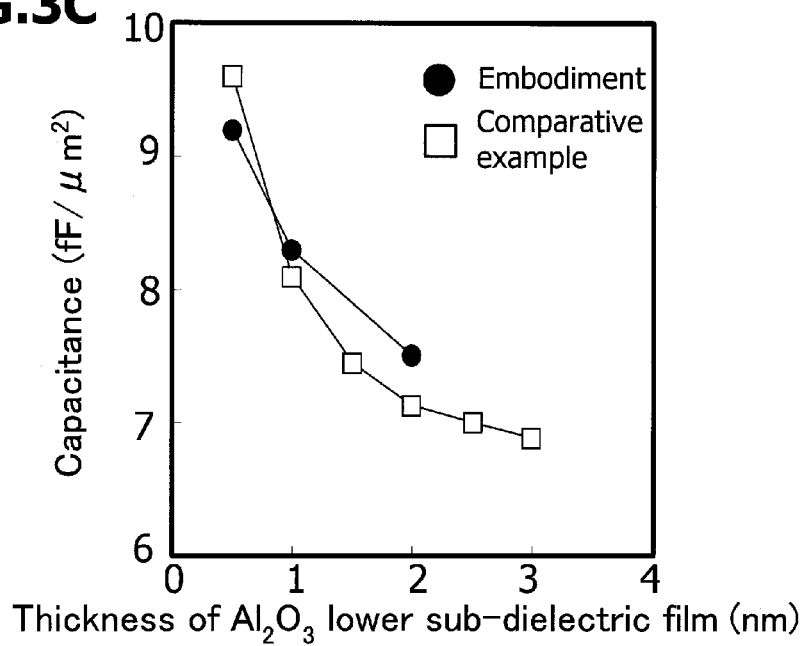
FIG. 3C is a graph representing a relation between a capacitance and a thickness of an $Al_2O_3$ lower subsidiary dielectric film.

FIG. 3C represents a relation between a capacitance per unit area of the MIM capacitors of the embodiment and comparative example and a thickness of the $Al_2O_3$ lower subsidiary dielectric film. The abscissa represents a thickness of the lower subsidiary dielectric film in the unit of "nm", and the ordinate represents a capacitance in the unit of "$fF/\mu m^2$". A black circle symbol and a white square symbol indicate measurement results of the MIM capacitors of the embodiment and comparative example, respectively. As the lower subsidiary dielectric film becomes thicker, a capacitance lowers. In the embodiment and comparative example, a thickness of each dielectric film is set so that the capacitances are approximately equal to each other.

Figure 3D:
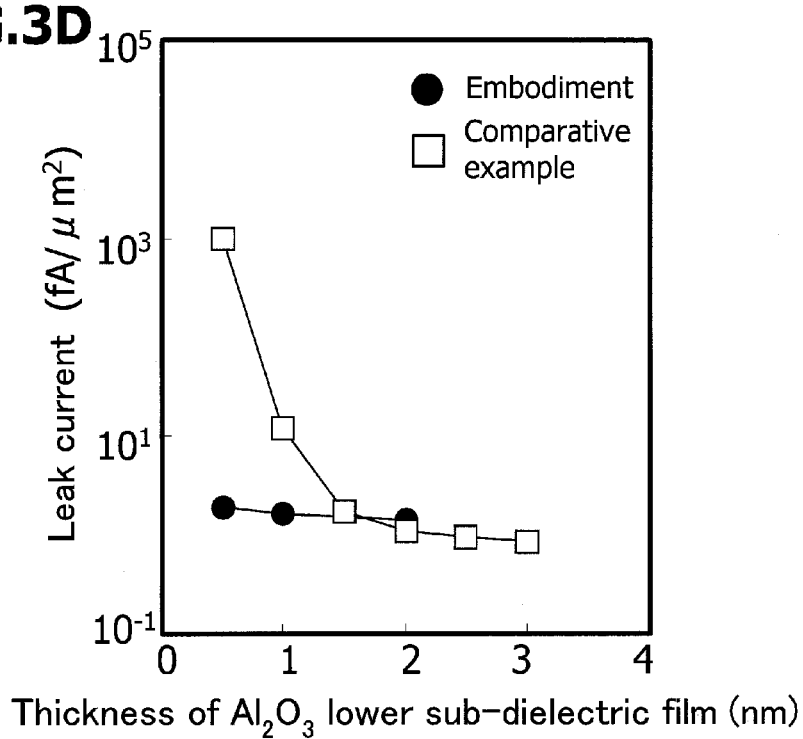
FIG. 3D is a graph representing a relation between a leak current and a thickness of an $Al_2O_3$ lower subsidiary dielectric film.

FIG. 3D represents a relation between a thickness of the lower subsidiary dielectric film and a leak current per unit area of the MIM capacitors of the embodiment and comparative example. The abscissa represents a thickness of the lower subsidiary dielectric film in the unit of "nm", and the ordinate represents a leak current in the unit of "$fA/\mu m^2$". The leak current was measured by applying a dc voltage of 3 V between the electrodes of the MIM capacitor. A black circle symbol and a white square symbol indicate measurement results of the MIM capacitors of the embodiment and comparative example, respectively.

In the sample of the comparative example, as a thickness of the lower subsidiary dielectric film becomes equal to or thinner than 1.5 nm, the leak current increases abruptly. In contrast, in the sample of the embodiment, the leak current is generally constant at least in a range between 0.5 nm and 2 nm of a thickness of a lower subsidiary dielectric film. Even if a thickness of the lower subsidiary dielectric film becomes equal to or thinner than 1.5 nm, an abrupt increase in the leak current does not occur.

It can be understood from this evaluation result that an increase in the leak current can be suppressed while a capacitance is maintained large, by forming the lower subsidiary dielectric film by anneal, as compared to forming the lower subsidiary dielectric film by CVD.

With reference to FIGS. 4A to 4D, description will be made on the evaluation results of the film quality of each $Al_2O_3$ film formed by anneal, CVD and sputtering.

Figure 4A:
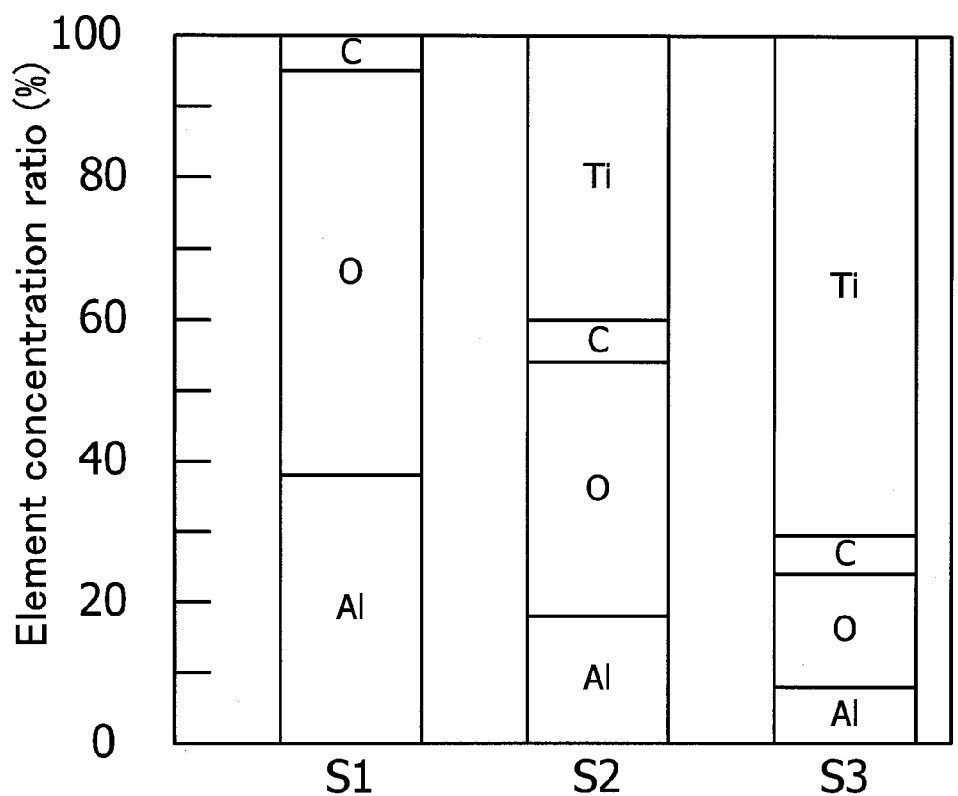
FIG. 4A is a graph representing element concentration ratios of samples S1 to S3 whose $Al_2O_3$ film is formed by anneal, CVD, and sputtering, respectively.
Figure 4A:
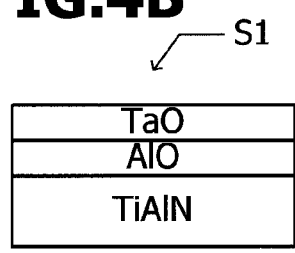
Figure 4A:
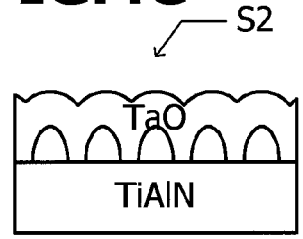
Figure 4A:
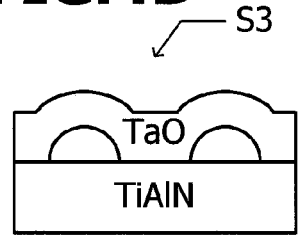

FIG. 4A represents XPS measurement results of an element concentration ratio of samples S1, S2 and S3. All the samples are formed by forming an $Al_2O_3$ film having a thickness of about 2 nm and a $Ta_2O_5$ film having a thickness of about 3 nm over a TiAlN film having a thickness of about 150 nm. The $Al_2O_3$ film of sample S1 was formed by anneal same as that for forming the lower subsidiary dielectric film 35 of the embodiment. The $Al_2O_3$ film of sample S2 was formed by CVD, and the $Al_2O_3$ film of sample S3 was formed by sputtering.

In sample S1, Ti is not detected, and only Al and O are detected substantially. It can be considered from this result that the $Al_2O_3$ film continuously covers the whole surface of the TiAlN film. In contrast, in samples S2 and S3, Ti underlying the $Al_2O_3$ film is detected. It can be considered from this result that the $Al_2O_3$ film does not continuously cover the whole surface of the TiAlN film and that there is a region where the $Ta_2O_5$ film is in direct contact with the TiAlN film, as illustrated in FIGS. 4C and 4D. A Ti detection ratio of sample S2 is lower than that of sample S3. It can be considered from this that a coverage factor of the TiAlN film by the $Al_2O_3$ film is higher in sample S2 than in sample S3.

If a thin $Al_2O_3$ film of about 2 nm thick is formed by CVD or sputtering, it is difficult to cover the whole surface of the lower electrode film of TiAlN or the like. Since a band gap of $Al_2O_3$ is wider than that of $Ta_2O_5$, disposing the $Al_2O_3$ film is effective for suppressing leak current. As illustrated in FIG. 3D, leak current of the sample of the comparative example increases abruptly as the $Al_2O_3$ lower subsidiary dielectric film is made thin. This may be ascribed to that the TiAlN lower electrode film and $Ta_2O_5$ main dielectric film are in direct contact with each other without involvement of the $Al_2O_3$ lower subsidiary dielectric film.

In contrast, as the $Al_2O_3$ lower subsidiary dielectric film is formed by anneal as in the embodiment, the whole surface of the lower electrode of TiAlN can be covered continuously even if the $Al_2O_3$ film is thinned. It can be considered therefore that an increase in leak current is suppressed when the $Al_2O_3$ lower subsidiary dielectric film is thinned.

Figure 5A:
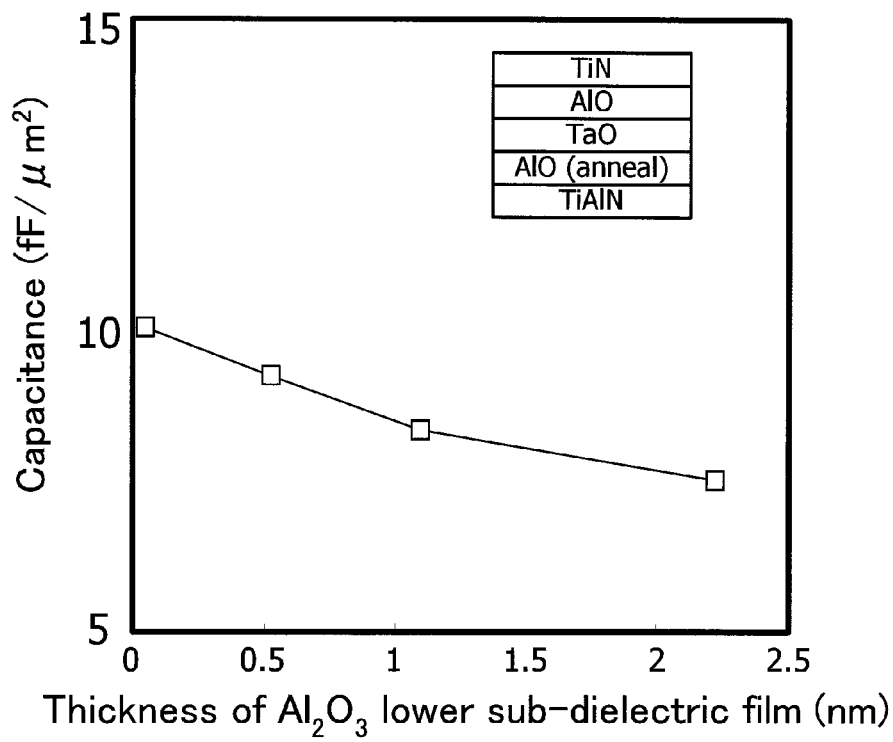
FIG. 5A is a graph representing a relation between a capacitance and a thickness of an $Al_2O_3$ lower subsidiary dielectric film.
Figure 5B:
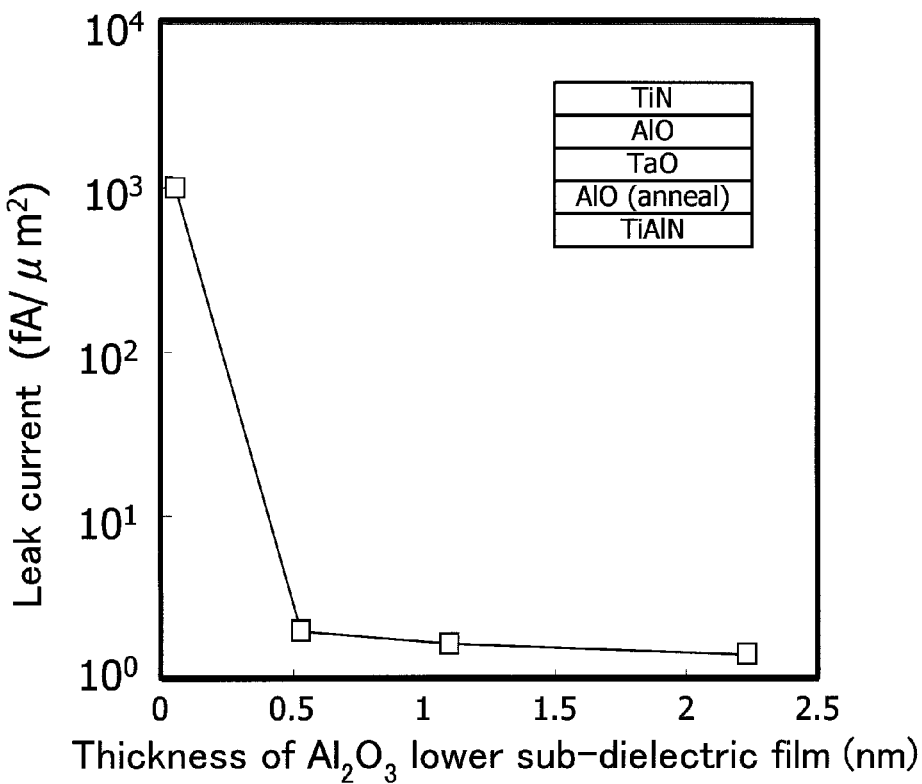
FIG. 5B is a graph representing a relation between a leak current and a thickness of an $Al_2O_3$ lower subsidiary dielectric film.

FIG. 5A represents a relation between a thickness of the $Al_2O_3$ lower subsidiary dielectric film and a capacitance of the MIM capacitor of the embodiment, and FIG. 5B represents a relation between a thickness of the $Al_2O_3$ lower subsidiary dielectric film and a leak current. The abscissas of FIGS. 5A and 5B represent a thickness of the $Al_2O_3$ lower subsidiary dielectric film in the unit of "nm", the ordinate of FIG. 5A represents a capacitance per unit area in the unit of "$fF/\mu m^2$", and the ordinate of FIG. 5B represents a leak current per unit area in the unit of "$fA/\mu m^2$".

It can be seen that as a thickness of the lower subsidiary dielectric film is set equal to or thinner than 0.5 nm, a leak current increases abruptly. This may be ascribed to that the lower subsidiary dielectric film does not cover continuously the whole surface of the lower electrode film. In order to suppress a leak current, it is preferable to set a thickness of the lower subsidiary dielectric film equal to or thicker than 0.5 nm.

Figure 6A:
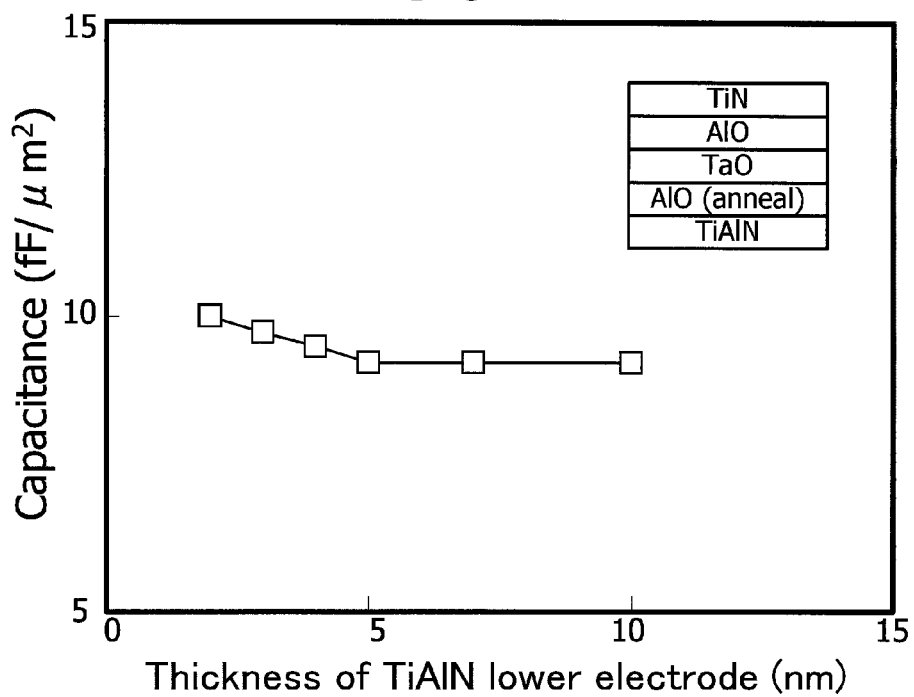
FIG. 6A is a graph representing a relation between a capacitance and a thickness of a TiAlN lower electrode.
Figure 6B:
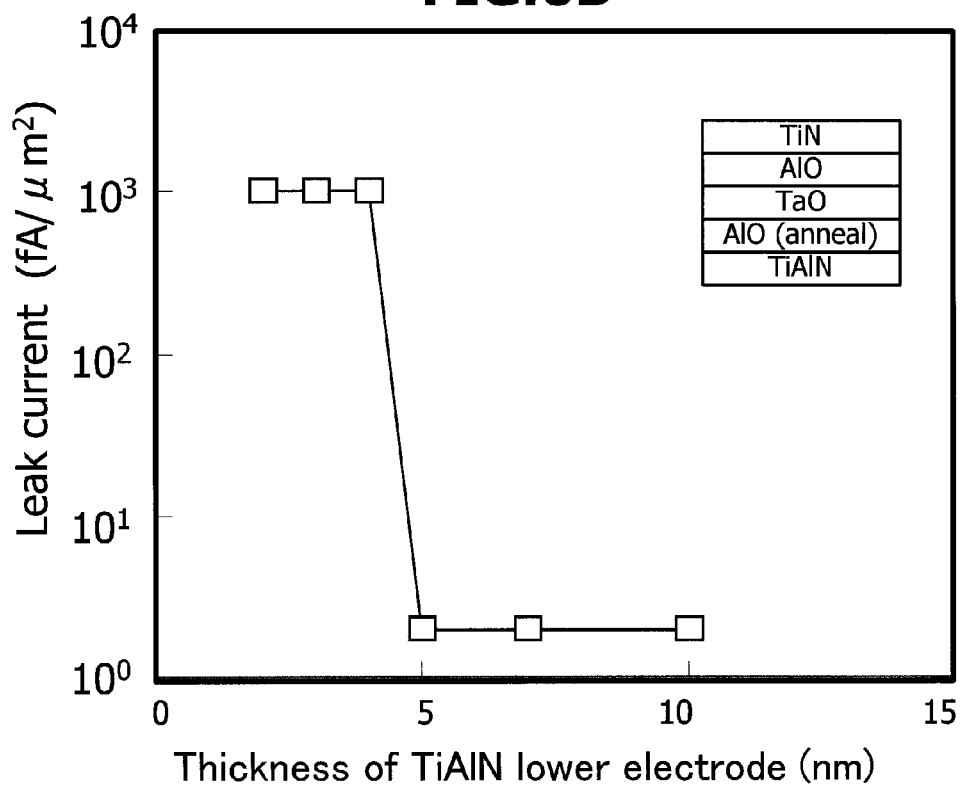
FIG. 6B is a graph representing a relation between a leak current and a thickness of a TiAlN lower electrode.

FIG. 6A represents a relation between a thickness of the TiAlN lower electrode and a capacitance of the MIM capacitor of the embodiment, and FIG. 6B represents a relation between a thickness of the TiAlN lower electrode and a leak current. The abscissas of FIGS. 6A and 6B represent a thickness of the lower electrode in the unit of "nm", the ordinate of FIG. 6A represents a capacitance per unit area in the unit of "$fF/\mu m^2$", and the ordinate of FIG. 6B represents a leak current per unit area in the unit of "$fA/\mu m^2$".

In forming the lower electrode, an AlTi alloy target was used having a content ratio (Al/Ti) of Al to Ti of 30 atm %. A thickness of the $Ta_2O_5$ main dielectric film was set to about 5 nm, and a thickness of the $Al_2O_3$ upper subsidiary dielectric film was set to about 6 nm. A thickness of the TiN upper electrode was set to about 150 nm. An anneal temperature for forming the lower subsidiary dielectric film was set to about 400° C.

A capacitance is hardly dependent upon a thickness of the lower electrode. However, a leak current increases abruptly as a thickness of the lower electrode becomes thinner than 5 nm.

This may be ascribed to that a sufficient amount of Al is not supplied from the lower electrode and the $Al_2O_3$ film continuously covering the whole surface cannot be formed. In order to prevent an abrupt increase in leak current, a thickness of the TiAlN lower electrode is preferably set equal to or thicker than 5 nm.

Figure 7:
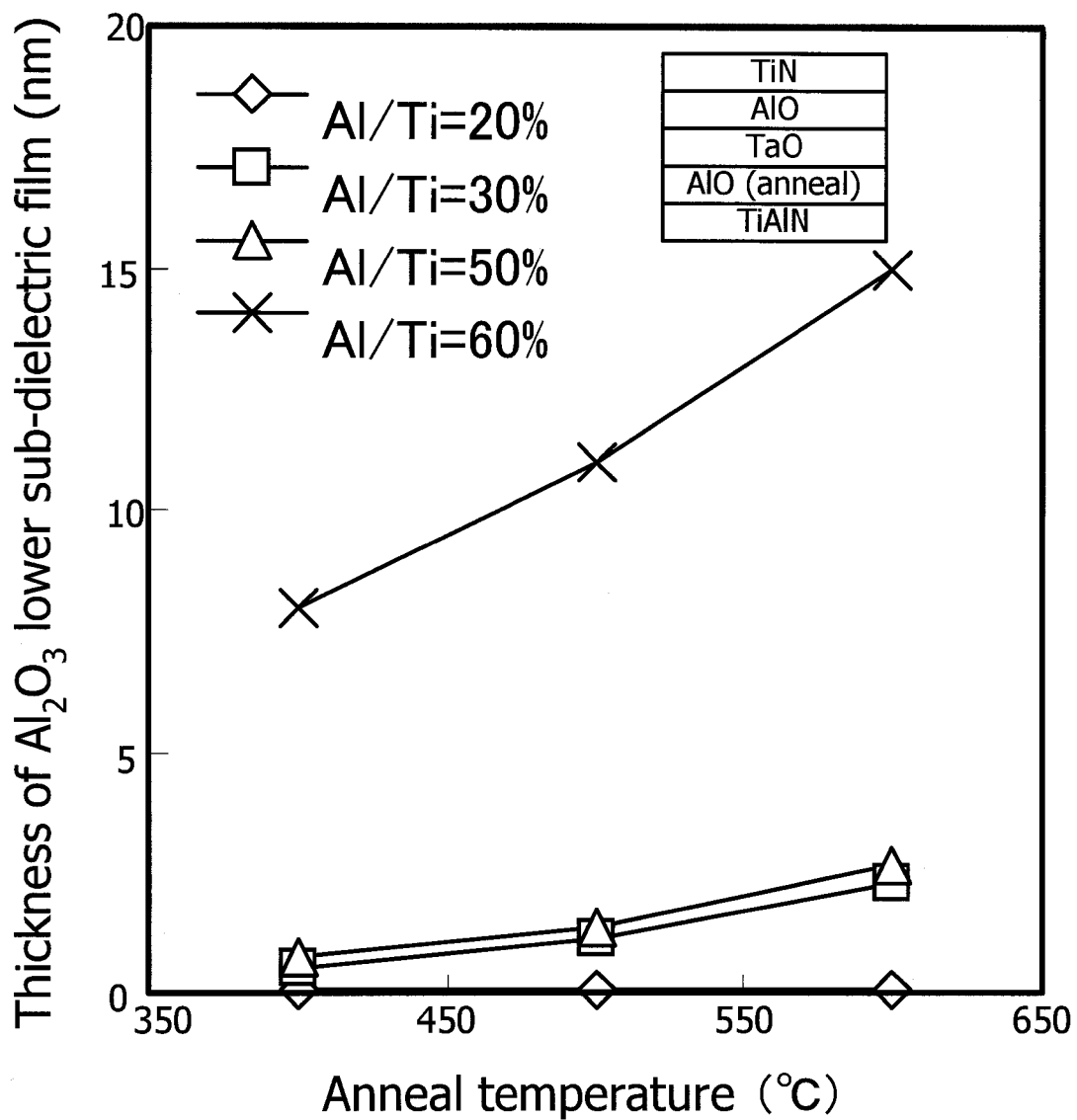
FIG. 7 is a graph representing a relation between an anneal temperature and a thickness of an $Al_2O_3$ lower subsidiary dielectric film, for samples having different ratios of Al to Ti contained in a TiAlN lower electrode.

With reference to FIG. 7, description will be made on preferable values of content amounts of Al and Ti of the lower electrode. A plurality of samples were formed by varying the content amounts of Al and Ti of the lower electrode, and thicknesses of the $Al_2O_3$ lower subsidiary dielectric film were measured.

FIG. 7 represents a relation between an anneal temperature for forming the $Al_2O_3$ lower subsidiary dielectric film and a thickness of the lower subsidiary dielectric film. The abscissa represents an anneal temperature in the unit of "° C.", and the ordinate represents a thickness of the $Al_2O_3$ lower subsidiary dielectric film in the unit of "nm". When an anneal temperature is set higher than about 600° C., $Al_2O_3$ and $Ta_2O_5$ are crystallized. Therefore, an anneal temperature may be varied in a range between 400° C. and 600° C. An anneal time was set to about 60 seconds.

A rhomboid symbol, a square symbol, a triangle symbol and an x symbol in FIG. 7 represent thicknesses of the lower subsidiary dielectric films of samples whose TiAlN films were formed by using AlTi alloy targets having a content ratio (Al/Ti) of Al to Ti of 20 atm %, 30 atm %, 50 atm % and 60 atm %, respectively. A content ratio (Al/Ti) of Al to Ti of the formed TiAlN film is approximately equal to that of the AlTi alloy target.

From the evaluation results represented in FIGS. 5A and 5B, it is preferable to set a thickness of the lower subsidiary dielectric film equal to or thicker than 0.5 nm. When the AlTi alloy target having a content ratio Al/Ti of 20 atm % is used, an $Al_2O_3$ film having a thickness equal to or thicker than 0.5 nm cannot be formed even if an anneal temperature is raised to about 600° C. This may be ascribed to that a sufficient amount of Al is not supplied from the lower electrode during anneal. In order to form the $Al_2O_3$ lower subsidiary dielectric film having a sufficient thickness, a content ratio (Al/Ti) of Al to Ti of the lower electrode film of TiAlN before anneal is preferably set equal to or higher than 30 atm %.

If the content ratio (Al/Ti) is set to 60 atm %, a film forming rate of the $Al_2O_3$ film becomes too fast so that a film thickness control becomes difficult. In order to improve the controllability of a film thickness of the $Al_2O_3$ lower subsidiary dielectric film, a content ratio (Al/Ti) of Al to Ti of the lower electrode film of TiAlN before anneal is preferably set equal to or lower than about 50 atm %.

Figure 8A:
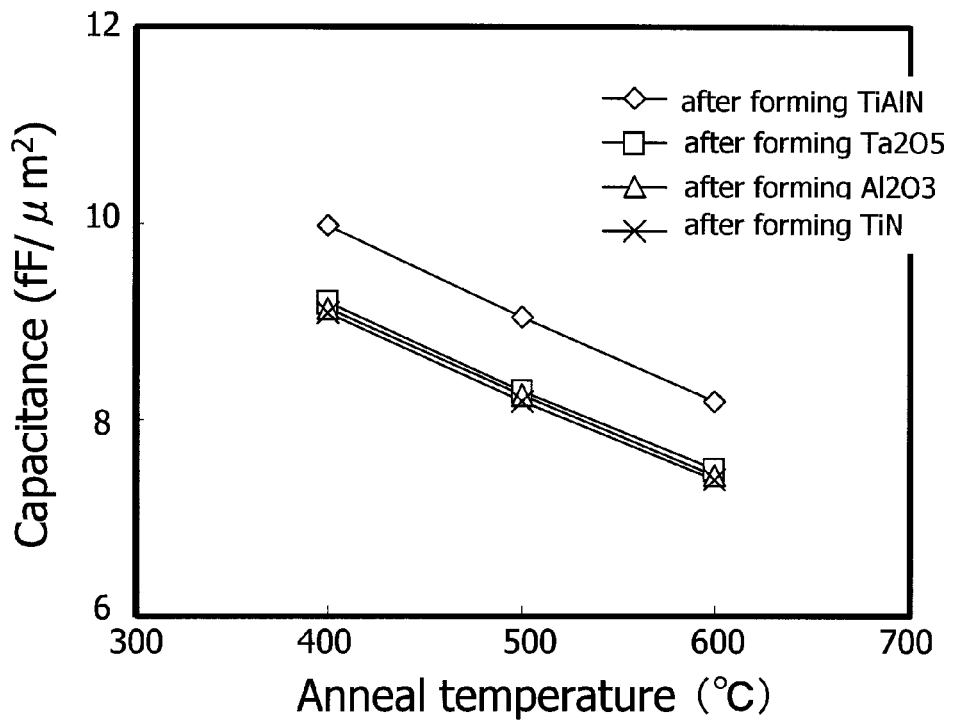
FIG. 8A is a graph representing a relation between an anneal temperature and a capacitance.
Figure 8B:
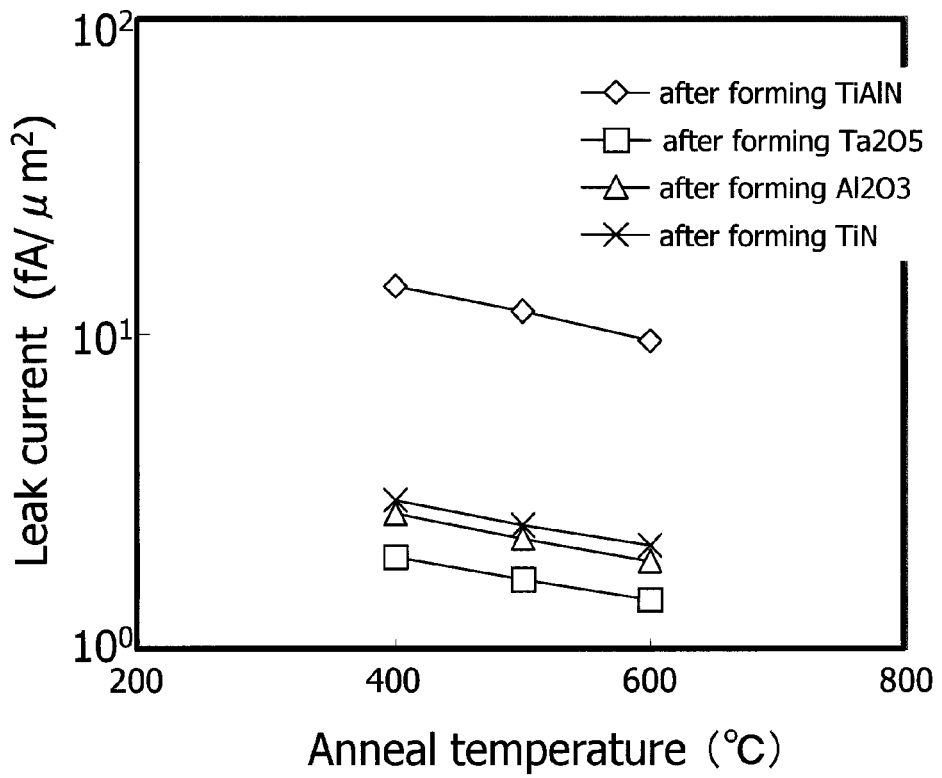
FIG. 8B is a graph representing a relation between an anneal temperature and a leak current, for samples annealed at different timings.

With reference to FIGS. 8A and 8B, description will be made on preferable timings of performing anneal. In the embodiment illustrated in FIGS. 1A to 1F, anneal is performed after the $Al_2O_3$ upper subsidiary dielectric film 32 is formed. A plurality of samples were manufactured by performing anneal immediately after the TiAlN lower electrode film 30 was formed, immediately after the $Ta_2O_5$ main dielectric film 31 was formed, or immediately after the TiN upper electrode 38 was formed, respectively.

FIG. 8A represents a relation between an anneal temperature and a capacitance, and FIG. 8B represents a relation between an anneal temperature and a leak current. The abscissas of FIGS. 8A and 8B represent an anneal temperature in the unit of "° C.", the ordinate of FIG. 8A represents a capacitance per unit area in the unit of "fF/µm$^2$", and the ordinate of FIG. 8B represents a leak current per unit area in the unit of "fA/µm$^2$". A rhomboid symbol, a square symbol, a triangle symbol and an x symbol in FIGS. 8A and 8B represent measurement results of the samples performing anneal immediately after the TiAlN lower electrode film is formed, immediately after the $Ta_2O_5$ main dielectric film is formed, immediately after the $Al_2O_3$ upper subsidiary dielectric film is formed and immediately after the TiN upper electrode film is formed, respectively.

The sample annealed after the TiAlN lower electrode film is formed and before the $Ta_2O_5$ film is formed has a larger capacitance than those of other samples, but has a large leak current. This may be ascribed to that the surface of the TiAlN lower electrode film is oxidized by oxygen remaining in an anneal atmosphere and becomes rough due to oxidization. If the TiN surface is exposed, oxidization will not occur even if anneal is performed under the same conditions. The sample annealed after the TiAlN lower electrode film is formed and before the $Ta_2O_5$ main dielectric film is formed is considered to have a rough surface because of oxidization of Al precipitated on the surface.

Samples annealed at any stage after the $Ta_2O_5$ main dielectric film is formed does not have a significant difference in the capacitance and leak current. Anneal may be therefore performed at any stage after the $Ta_2O_5$ main dielectric film is formed.

Figure 9:
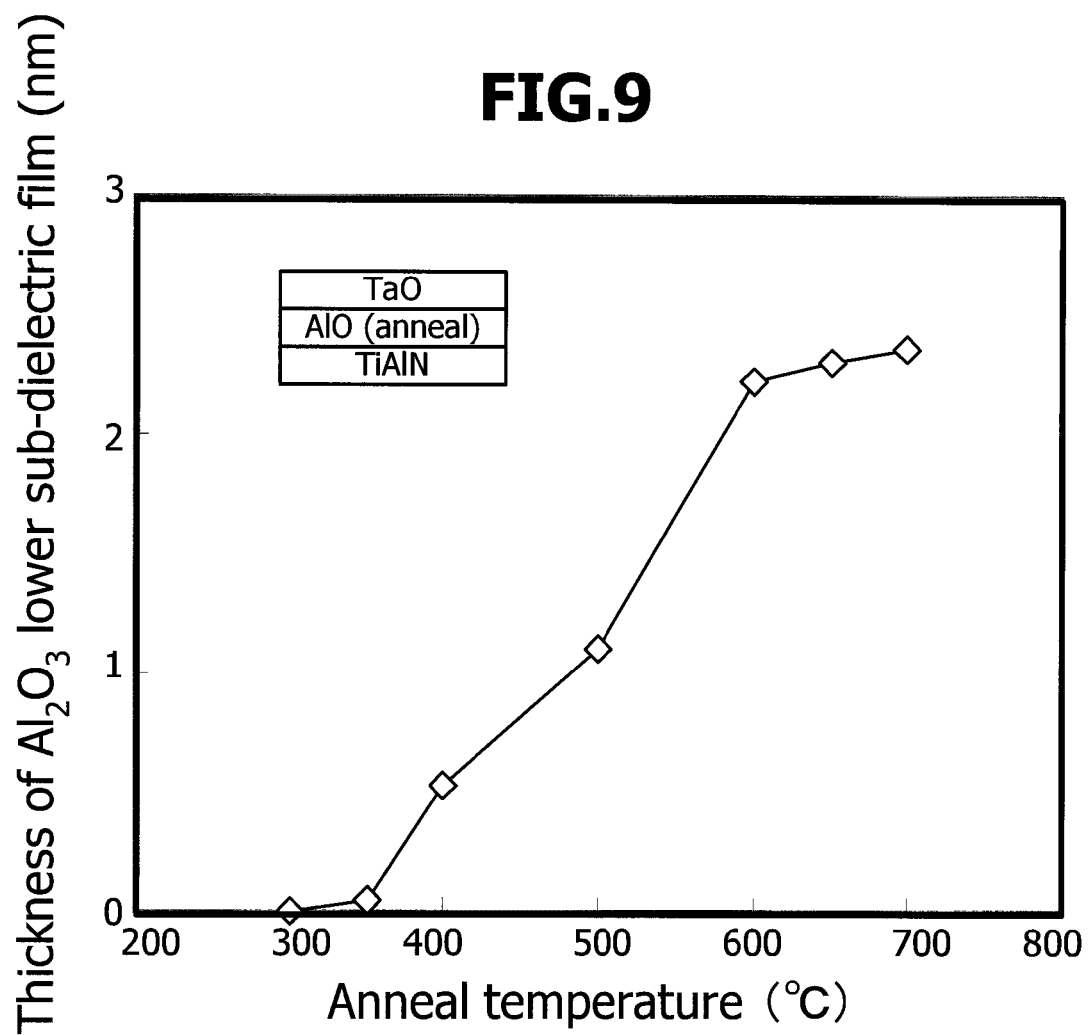
FIG. 9 is a graph representing a relation between an anneal temperature and a thickness of an $Al_2O_3$ lower subsidiary dielectric film.

FIG. 9 represents a relation between an anneal temperature and a thickness of the $Al_2O_3$ lower subsidiary dielectric film. The sample as the evaluation object illustrated in FIG. 9 was annealed after the $Ta_2O_5$ main dielectric film is formed. A content ratio (Al/Ti) of Al to Ti in the TiAlN lower electrode film was set to about 50 atm %. An anneal time was set to about 60 seconds.

At an anneal temperature equal to or lower than 350° C., it is difficult to form the lower subsidiary dielectric film having a thickness equal to or thicker than 0.5 nm. A leak current increases as seen from the evaluation result illustrated in FIG. 5B. In order to prevent an increase in leak current, an anneal temperature is preferably set equal to or higher than 400° C. If an anneal temperature is set higher than 600° C., $Al_2O_3$ and $Ta_2O_5$ are crystallized. An anneal temperature is therefore preferably set equal to or lower than 600° C.

In the embodiment described above, the MIM capacitor of a so-called stack structure disposed just above the conductive plug 20 has been described. The embodiment is applicable to a MIM capacitor of a planar structure.

Figure 10:
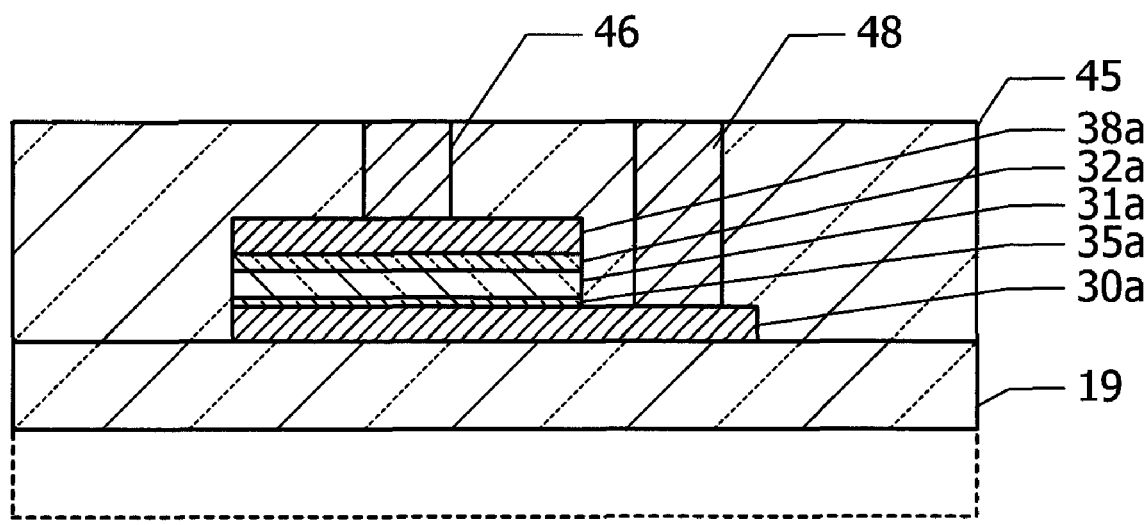
FIG. 10 is a cross sectional view illustrating a MIM capacitor of a planar structure.

FIG. 10 is a cross sectional view illustrating a MIM capacitor of the planar structure. Description will be made by paying attention to the different points from the MIM capacitor of the stack structure illustrated in FIG. 1F.

In the MIM capacitor of the planar structure, the plan shape of the lamination structure from a lower subsidiary dielectric film 35a to an upper electrode 38a is set smaller than that of a lower electrode 30a. In the MIM capacitor of the stack structure, the lower electrode 30a is connected to the conductive plug 20 disposed under the lower electrode. In the planar structure, a conductive plug is not disposed just under the MIM capacitor. Instead, the lower electrode 30a is connected to a conductive plug 48 passing by the upper electrode 38a.

Also in the planer structure, an $Al_2O_3$ lower subsidiary dielectric film 35a is formed by anneal after a $Ta_2O_5$ main dielectric film 31a is formed. Therefore, as in the case of the embodiment of the stack structure, it is possible to prevent a leak current from being increased, while a capacitance is maintained large.

In the embodiment described above, the lower subsidiary dielectric film 35 between the TiAlN lower electrode film 30 and $Ta_2O_5$ main dielectric film 31 is formed by anneal. The upper subsidiary dielectric film 32 may be formed by anneal, or both the lower and upper $Al_2O_3$ dielectric films 35 and 32 may be formed by anneal. If the upper subsidiary dielectric film 32 is formed by anneal, a TiAlN upper electrode film 38 is formed on the $Ta_2O_5$ main dielectric film 31, and thereafter anneal is performed. By reaction between O in the main dielectric film 31 and Al in the upper electrode film 38, the upper subsidiary dielectric film 32 of $Al_2O_3$ is formed at the interface between the two films.

In the embodiment described above, material of the lower electrode film 30 is represented by "TiAlN", it is apparent from the description of the embodiment that this representation does not mean that the composition ratio of Ti, Al and N is 1:1:1. Similarly, although material of the upper electrode film 38 is represented by "TiN", this representation does not mean that the composition ratio of Ti and N is 1:1. Further, in the embodiment described above, although materials of the dielectric film are represented by "$Al_2O_3$" and "$Ta_2O_5$", the element composition ratio of an actually formed dielectric film is not always coincident with the stoichiometric composition ratio. Even if the element composition ratio of an actually formed dielectric film is shifted from the stoichiometric composition ratio, the effects equivalent to those of the above-described embodiment can be obtained.

A semiconductor device manufactured by the manufacture method has a capacitor wherein a first electrode containing TiAlN, a subsidiary dielectric film containing aluminum oxide, a main dielectric film containing tantalum oxide and a second electrode are laminated in an order recited or in a reverse order over a semiconductor substrate, the first electrode and the subsidiary dielectric film being in contact with each other, and the subsidiary dielectric film and the main dielectric film being in contact with each other.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiment of the present inventions have been described in detail, it should be understood that the various changes, substitutions, and alterations could be made hereto without departing from the spirit and scope of the invention.

What is claimed is:

1. A manufacture method for a semiconductor device comprising:
    forming a first electrode film comprising TiAlN and a main dielectric film comprising tantalum oxide over a semiconductor substrate;
    performing anneal in a state that the first electrode film and the main dielectric film are formed, to react aluminum in the first electrode film with oxygen in the main dielectric film and form a subsidiary dielectric film comprising aluminum oxide at an interface between the first electrode film and the main dielectric film; and
    forming a second electrode film facing the first electrode film via the main dielectric film and the subsidiary dielectric film.

2. The manufacture method for a semiconductor device according to claim 1, wherein a thickness of the first electrode film before the anneal is equal to or thicker than 5 nm.

3. The manufacture method for a semiconductor device according to claim 2, wherein a content ratio of Al to Ti of the first electrode film before the anneal is in a range between 30 atm % and 50 atm %.

4. The manufacture method for a semiconductor device according to claim 3, wherein an anneal temperature of the anneal is in a range between 400° C. and 600° C.

5. The manufacture method for a semiconductor device according to claim 2, wherein an anneal temperature of the anneal is in a range between 400° C. and 600° C.

6. The manufacture method for a semiconductor device according to claim 1, wherein a content ratio of Al to Ti of the first electrode film before the anneal is in a range between 30 atm % and 50 atm %.

7. The manufacture method for a semiconductor device according to claim 6, wherein an anneal temperature of the anneal is in a range between 400° C. and 600° C.

8. The manufacture method for a semiconductor device according to claim 1, wherein an anneal temperature of the anneal is in a range between 400° C. and 600° C.

9. The manufacture method for a semiconductor device according to claim 1, further comprising forming another subsidiary dielectric film comprising aluminum oxide between the main dielectric film and the second electrode film.

* * * * *